United States Patent
Hamanaka

(10) Patent No.: US 6,482,737 B2
(45) Date of Patent: Nov. 19, 2002

(54) FABRICATION METHOD OF IMPLANTING SILICON-IONS INTO THE SILICON SUBSTRATE

(75) Inventor: Nobuaki Hamanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 36 days.

(21) Appl. No.: 09/837,956

(22) Filed: Apr. 19, 2001

(65) Prior Publication Data

US 2002/0155701 A1 Oct. 24, 2002

(30) Foreign Application Priority Data

May 11, 2000 (JP) ........................................ 2000-139120

(51) Int. Cl.[7] .............................................. H01L 21/44
(52) U.S. Cl. ...................... 438/653; 438/514; 438/520; 438/523; 438/528; 438/533; 438/655; 438/659; 438/682; 438/627; 438/630
(58) Field of Search .......................... 438/653, 654–655, 438/659, 664, 682–683, 648–651, 643, 637–640, 627–630, 592, 514, 516, 520, 523, 528, 533

(56) References Cited

U.S. PATENT DOCUMENTS 5,554,565 A * 9/1996 Liaw et al. .................. 438/233
5,565,690 A * 10/1996 Theodore et al. ............. 257/18
5,851,912 A * 12/1998 Liaw et al. .................. 438/621
6,407,002 B1 * 6/2002 Lin et al. ..................... 438/713

FOREIGN PATENT DOCUMENTS

| JP | 02161722 | 6/1990 |
| JP | 04014874 | 1/1992 |

* cited by examiner

Primary Examiner—Tuan H. Nguyen
Assistant Examiner—Thanh Nguyen
(74) Attorney, Agent, or Firm—Katten Muchin Zavis Rosenman

(57) ABSTRACT

In a method of fabricating a semiconductor device in which a metal film is formed that is to serve as the diffusion barrier layer material of a plug electrode material that is used when forming a plug electrode on a diffusion layer electrode or a gate electrode in which a metal silicide layer has been formed, increase in the resistance of the plug electrode is prevented. Immediately after the formation of a plug hole by a dry etching method, silicon ions are implanted with an acceleration voltage of at least 20 KeV and at a dosage of at least $1 \times 10^{13}$ atoms/cm$^2$, following which a titanium film and a titanium nitride film are formed as the metal film by a sputtering method without carrying out etching by an RF etching method.

10 Claims, 5 Drawing Sheets

Ij: Injection
RF: Radial Frequency

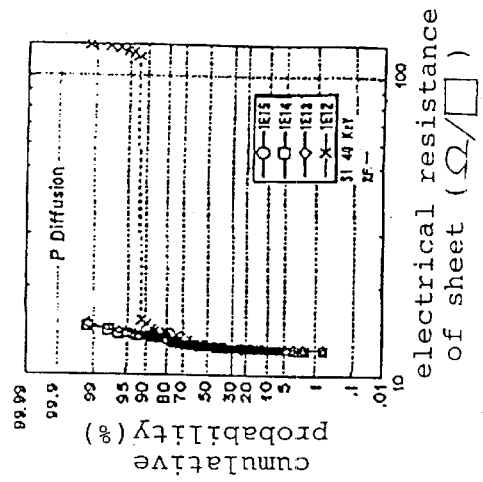
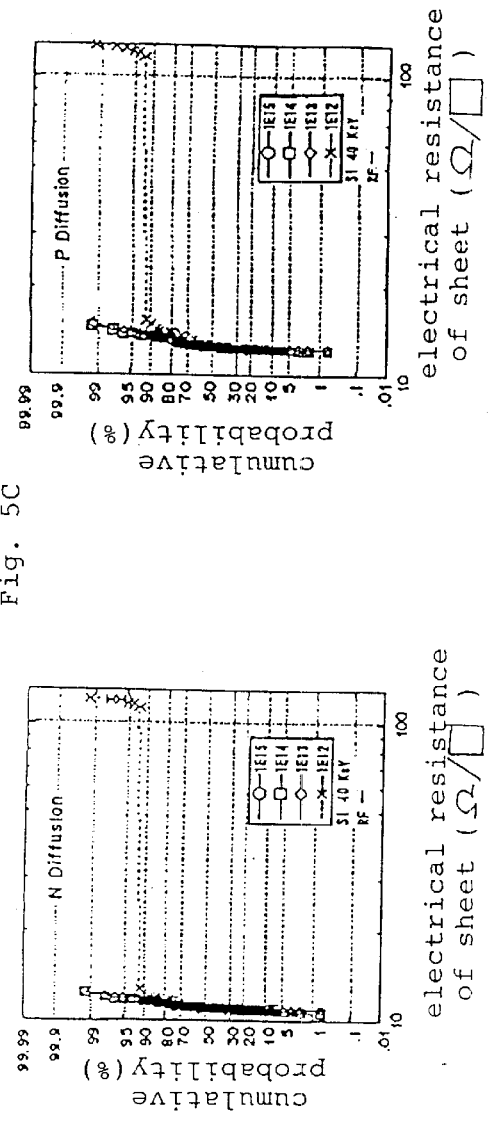
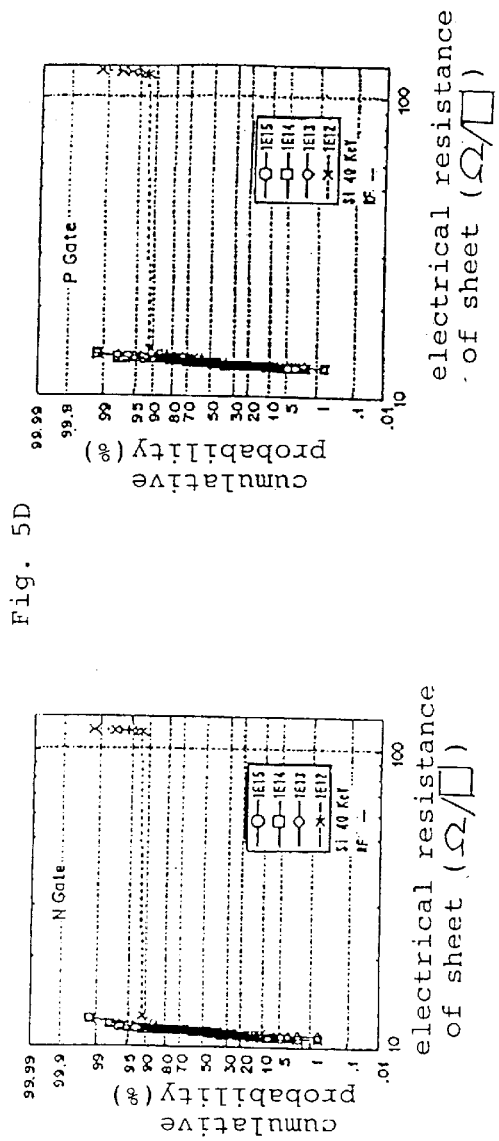
Fig. 5A   Fig. 5B   Fig. 5C   Fig. 5D

US 6,482,737 B2

FABRICATION METHOD OF IMPLANTING SILICON-IONS INTO THE SILICON SUBSTRATE

BACKGROUND OF THE INVENTION

1. Field of the Invention

The present invention relates to a fabrication method of a semiconductor device, and particularly to a fabrication method for forming plug electrodes as wiring between MOS field effect transistor (MOSFET) elements having gates, sources, and drains that are converted to a silicide with self alignment. The present invention further relates to a transistor fabrication method in which, when forming a diffusion barrier layer of a plug electrode material, which is wiring between MOS field effect transistor (MOSFET) elements, by a high-temperature sputtering method, the adhesion between a metal silicide film and the diffusion barrier layer of the plug electrode material is improved, and a diffusion barrier layer of a plug electrode material having highly uniform low resistance is formed.

2. Description of the Related Art

One method of fabricating a semiconductor device consists in forming a plug electrode as the wiring between MOS field effect transistor (MOSFET) elements. The procedures of this fabrication method are explained with reference to the sectional views of FIGS. 1A to 1F.

First, as shown in FIG. 1A, n-well 202 is formed in silicon substrate 201 by a known method. Field oxide film 203 is next formed by a selective oxidation method. Gate insulation film 204, for example, a silicon oxide film are made up by turn, and a polycrystalline silicon are successively grown on the active region that is surrounded by this field oxide film 203, and the polycrystalline silicon is doped with phosphorus by a known method to decrease the electrical resistance of the polycrystalline silicon.

The polycrystalline silicon is next patterned by the known methods of photolithography and dry etching to form gate electrode 205, as shown in FIG. 1A. Next, a low-concentration n-type impurity layer (not shown) and a low-concentration p-type impurity layer (not shown) are formed by photolithography and ion implantation. Side wall spacers 206 composed of a silicon oxide film or a silicon nitride film are next formed on the sides of gate electrode 205 using a known CVD method and an etching method.

A source-drain region of an n-type impurity layer and a source-drain region of a p-type impurity layer are next formed by photolithography and ion implantation. By these processes, n-type source-drain region 207 and p-type source-drain region 208 are formed as an LDD (lightly doped drain )structure.

Next, after removing the native oxide film (not shown) on the silicon substrate surface and on the surface of the polycrystalline silicon, which is the gate electrode, cobalt silicide film 209 is formed with self-alignment only over the gate electrode and diffusion layer according to a known method, as shown in FIG. 1B.

An insulating film such as a silicon oxide film is next grown using a known CVD (chemical vapor deposition) method, and the insulating film surface is then leveled using a known CMP (chemical mechanical polishing) method. The insulating film is next patterned using known photolithography and dry etching methods, and plug hole 210 is then formed for forming a plug electrode, as shown in FIG. 1C.

After cleaning the silicon substrate with, for example, a mixed solution of dilute sulfuric acid and hydrogen peroxide, the native oxide film (not shown in the figure) that has formed on the surface of the silicon substrate is removed by a known RF (radio frequency) sputtering method in an RF sputtering chamber which is attached to a sputtering device using plasma in which oxygen is mixed. At this time, a portion of cobalt silicide film 209 that is present at the bottom of plug hole 210 is etched as shown in FIG. 1D.

Titanium film 211 is next grown as shown in FIG. 1E by a sputtering method in an argon plasma atmosphere and under a heating condition of 300° C. in a chamber of a sputtering device other than the above-described RF sputtering chamber. Still further, titanium is sputtered using a known reactive sputtering method under a heat condition of at least 300° C. in a mixed argon-nitrogen gas plasma atmosphere to form titanium nitride film 212 on the silicon substrate. A Rapid Thermal Annealing process (RTA) is then carried out to form titanium silicide film 213 at the interface of titanium film 211 and cobalt silicide film 209.

After cleaning the silicon substrate with, for example, an aqueous mixed solution of dilute sulfuric acid and hydrogen peroxide, a tungsten film is grown using a known CVD method, following which the surface of the tungsten film is leveled using a known CMP method to form plug electrode 214 as shown in FIG. 1F.

The above-described method of fabricating a semiconductor device was employed to convert the polycrystalline silicon of a p-type electrode that had been doped with boron ions at a high concentration of 3×1015 atoms/cm2 to cobalt silicide and then form a plug electrode above it. Subsequent measurement of the sheet resistance of the plug portion showed that the sheet resistance was at least 11 Ω/(unit area), and a comparison of the sheet resistance within the silicon substrate surface revealed a variation of at least 3 Ω. Similarly, a p-type diffusion layer electrode was converted to cobalt silicide and a plug electrode then formed above it. Subsequent measurement of the sheet resistance of the plug portion showed a sheet resistance of at least 11 Ω/(unit area), while a comparison of the sheet resistance within the silicon substrate surface revealed a variation of at least 6 Ω/(unit area).

The above-described method of fabricating a semiconductor device was also employed to convert the polycrystalline silicon of an n-type gate electrode on the silicon substrate that was doped with arsenic ions at a high concentration of 5×1015 atoms/cm2 to cobalt silicide and then form a plug electrode above it. Subsequent measurement of the sheet resistance of the plug portion showed that the sheet resistance was at least 10 Ω/(unit area), and a comparison of the sheet resistance within the silicon substrate surface revealed a variation of at least 4 Ω/(unit area). Similarly, when a p-type diffusion layer electrode was converted to cobalt silicide and a plug electrode formed above it, subsequent measurement of the sheet resistance of the plug portion showed a sheet resistance of at least 10 Ω/(unit area), and a comparison of the sheet resistance within the silicon substrate revealed a variation of at least 4 Ω/(unit area).

SUMMARY OF THE INVENTION

In the above-described fabrication method of a semiconductor device, the sheet resistance of a plug electrode was high and the variation within the surface was large. It is therefore an object of the present invention to provide a fabrication method of a semiconductor device for forming on a silicide film a refractory metal film having lower resistance than the prior art.

As the result of continued research to realize a fabrication method of a semiconductor device that can achieve the above-described object of the present invention, the inventors of the present invention discovered that the increased sheet resistance of the plug portion and the large variation of sheet resistance within the surface both result from etching a portion of the metal silicide film by the RF sputtering method that is carried out immediately before growing the titanium film that is to serve as the diffusion barrier layer of the plug electrode.

As a result of further research, the inventors of the present invention also discovered that, in a case in which the titanium film is grown without carrying out the above-described RF sputtering method before depositing the titanium film that serves as the diffusion barrier layer of the plug electrode, a titanium silicide film is not formed at the interface of the titanium film and metal silicide film. As a result, the sheet resistance of the plug portion is further increased, variation within the surface becomes larger, and adhesion between the titanium film and metal silicide film is adversely affected, in some cases giving rise to exfoliation of the film.

According to the present invention, a method of fabricating a semiconductor device is provided in which, in a method of fabricating a semiconductor device in which a metal film, which is to serve as a diffusion barrier layer of an inter-element plug electrode of semiconductor elements, is formed over the entire surface of a silicon substrate using a sputter deposition method; wherein before the sputter deposition of the metal film, all portions of the substrate are covered by a photoresist except for portions of plug formation, following which silicon ions are implanted into the substrate, the photoresist is removed, and finally, the substrate is cleaned with a chemical fluid.

The present invention consists in implanting silicon ions in the bottom portion of a plug hole and then depositing a titanium film, which is to serve as the diffusion barrier layer of the plug electrode, whereby a titanium silicide film of low resistance is formed at the bottom of the plug hole without lowering the resistance of the plug electrode and without bringing about peeling of the film.

As for an explanation of this effect, silicon ions are implanted into the silicon substrate after etching the plug hole with the photoresist still in place. The photoresist is next removed and the silicon substrate is cleaned with a chemical fluid and then conveyed to a sputtering device. After growing a titanium film and titanium nitride film by a sputtering method, annealing is performed to form the plug electrode. The sheet resistance of the p-type gate electrode is compared for cases in which the surface etching process by a RF sputtering method is carried out or omitted immediately preceding the above-described titanium sputtering process.

Compared to a case in which surface etching is not performed, the sheet resistance for a case in which surface etching is performed by the RF sputtering method is approximately 10% higher, and the variation in sheet resistance within the surface is approximately 10% larger.

RF etching reduces the film thickness of the cobalt disilicide (CoSi2) film at the bottom of plug holes. Variation in plasma concentration within the silicon wafer surface is considerable when RF etching is carried out, and the thickness of the cobalt disilicide (CoSi2) film at the bottom of plug holes therefore also varies considerably within the wafer surface. As a result, the sheet resistance of the silicide film as a whole becomes high and variation in sheet resistance increases in cases in which the area of the open hole of a plug hole is large. As a result, resistance of the plug electrode increases and variation in resistance also becomes large.

If RF etching is not carried out, however, the thickness of the cobalt disilicide (CoSi2) film does not decrease and the sheet resistance of the silicide film does not become high.

To continue, a plug hole is etched, the photoresist is removed, the silicon substrate is cleaned with a chemical fluid, and the silicon substrate is conveyed to a sputtering device. The titanium film and titanium nitride film are next grown by a sputtering method, annealing is performed, and the plug electrode film is grown to form the electrode.

The shape of the silicon wafer is compared for a case in which the surface etching process is performed by an RF sputtering method immediately before the above-described titanium sputtering process, and for a case in which the surface etching process is not carried out.

In the case in which RF etching is carried out, despite long time heating of the wafer to grow a tungsten film by a CVD method for the purpose of forming a plug electrode, film exfoliation on the silicon substrate surface cannot be observed by the unaided eye and a good shape is maintained. In a case in which RF etching is not carried out, however, film peeling could be observed by the unaided eye in portions of the silicon wafer immediately following the above-described growth of tungsten. Even in cases in which film peeling did not occur, the resistance of the plug electrode in some cases increased markedly (for example, eight times the normal value) in portions of the silicon wafer.

Strong bonding is maintained between cobalt and silicon atoms in the cobalt disilicide (CoSi2) film at the bottom of a plug when RF etching is not carried out. When titanium and silicon react to form titanium silicide, however, the silicon atoms are reaction diffusion "seeds."

Reaction between titanium and silicon therefore tends not to occur when RF etching is not carried out, and a titanium silicide film is therefore difficult to be formed.

Furthermore, cobalt that has undergone conversion to a silicide has a characteristic that impedes formation of an alloy with titanium.

The significance of the foregoing explanation is that little chemical bonding occurs between a cobalt disilicide (CoSi2) film and a titanium film, and adhesion between the two films is therefore extremely poor, and when a titanium film expands during the course of long-term heating, the titanium film therefore tends to peel away from the cobalt disilicide (CoSi2) film. Since a large force is also exerted on the overlying tungsten film, exfoliation of the entire structure tends to occur.

Exfoliation similarly occurs if RF etching is not carried out even in cases in which a titanium nitride film is grown directly on the cobalt disilicide (CoSi2) film. This state arises from the fact that the cobalt and silicon that form the cobalt disilicide (CoSi2) film tend to react with neither the titanium nor the nitride in the titanium nitride film.

In contrast, a portion of the bonds between cobalt and silicon that are present in the cobalt disilicide (CoSi2) film at the bottom of a plug are cut in the plasma atmosphere when RF etching is carried out, and titanium atoms and silicon atoms therefore tend to react relatively easily in the annealing that immediately follows sputtering, whereby a titanium silicide film having high adhesion with the cobalt disilicide (CoSi2) film, is formed. Adhesion between a titanium silicide film and a titanium nitride film is high, and exfoliation therefore does not occur.

In a case in which silicon ions are implanted immediately following hole formation of a plug hole by etching, exfoliation does not occur even if RF etching is not carried out.

This state occurs because the cobalt disilicide (CoSi2) film at the bottom of a plug hole becomes non-crystalline due to the ion implantation, and a portion of the bonds between cobalt and silicon that are present in the film are cut, whereby titanium atoms react relatively easily with silicon atoms in the process of annealing that immediately follows sputtering, and a titanium silicide film having high adhesion with cobalt disilicide (CoSi2) film is formed. In addition, the amorphous cobalt disilicide (CoSi2) film is recrystallized during the annealing that immediately follows sputtering. Exfoliation therefore does not occur and resistance does not increase.

The above and other objects, features, and advantages of the present invention will become apparent from the following description based on the accompanying drawings which illustrate an example of a preferred embodiment of the present invention.

BRIEF DESCRIPTION OF THE DRAWINGS

FIGS. 5A to 5D show the relation between plug resistance and the dosage of ion implantation in a case, in which a titanium film and a titanium nitride film are formed as a metal diffusion barrier layer after ion implantation that follows formation of a plug hole, in the fabrication method of the present invention.

DETAILED DESCRIPTION OF THE PREFERRED EMBODIMENTS

Referring now to the accompanying figures, an embodiment of the present invention is next explained. FIGS. 2A to 2D are sectional views of elements in each step of the fabrication method of a semiconductor device in which metal films are formed in a plug portion of wiring between semiconductor elements.

Figure 1D:
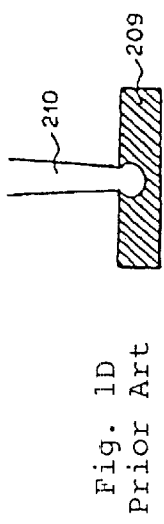
FIGS. 1A to 1F are sectional views of elements in each step of one example of the prior art.
Figure 1E:
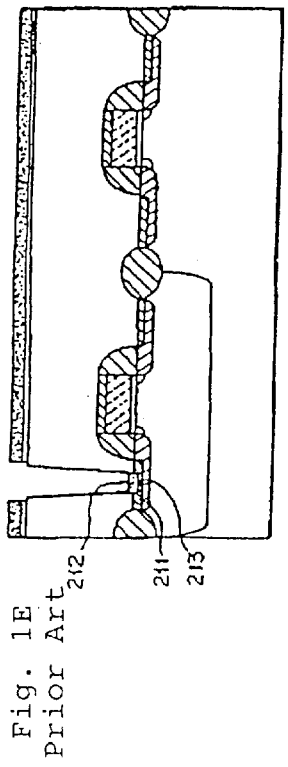
Figure 1F:
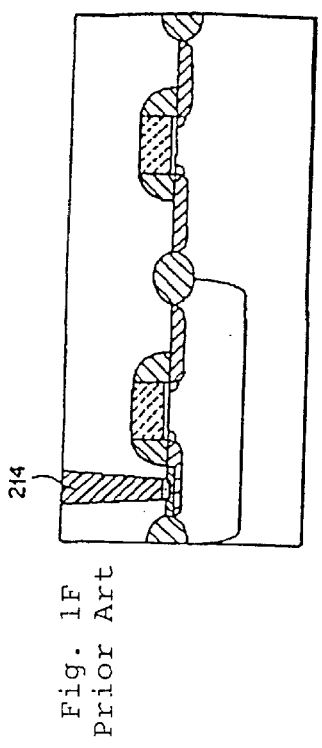
Figure 1A:
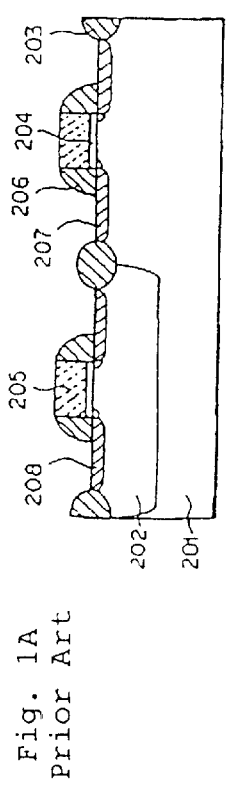
Figure 1B:
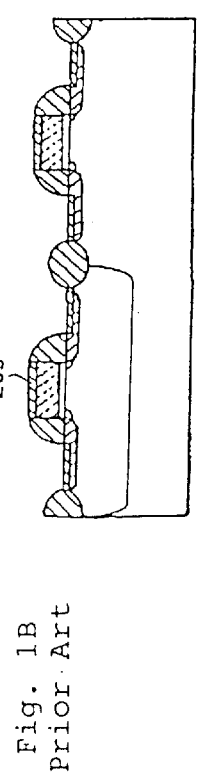
Figure 1C:
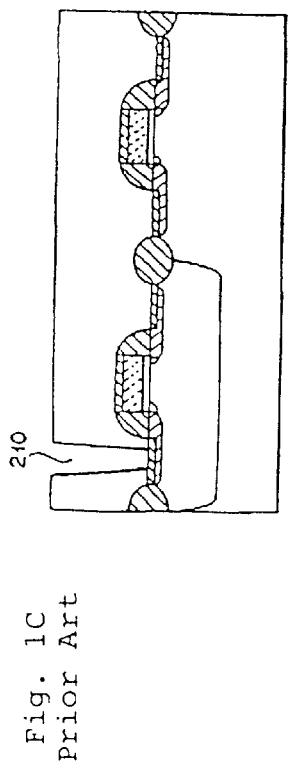
Figure 2A:
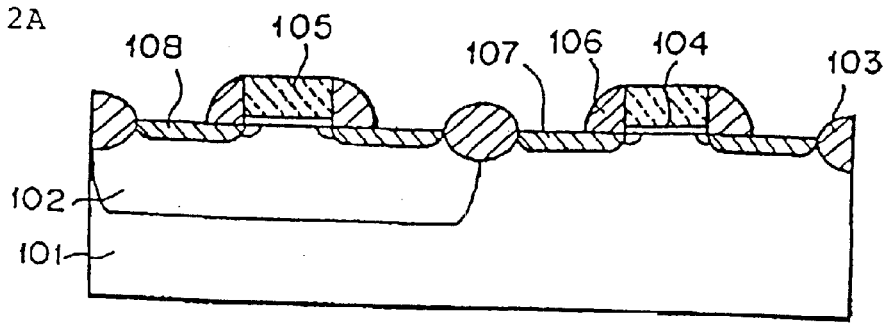
FIGS. 2A to 2D are sectional views of an element in each step of forming semiconductor elements as well as wiring between semiconductor elements of the present invention.

First, as shown in FIG. 2A, n-type well 102, field oxide film 103, gate insulation film 104, gate electrode 105, side wall spacers 106, n-type source-drain region 107, and p-type source-drain region 108 are formed on silicon substrate 101 by known methods.

Figure 2B:
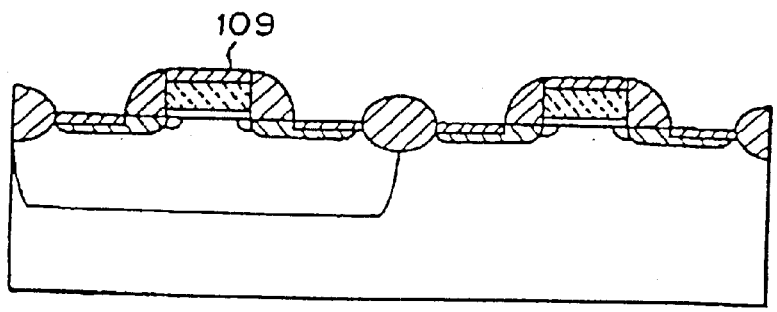

Next, as shown in FIG. 2B, the native oxide film (not shown) is removed from the surface of the polycrystalline silicon, which is the gate electrode, and the surface of the silicon substrate, and cobalt silicide film 109 is formed with self-alignment on only the gate electrodes and diffusion layer by known methods.

Figure 2C:
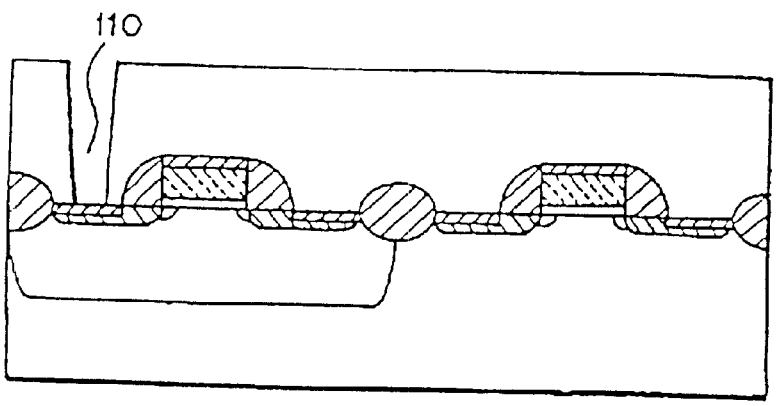

An insulating film composed of, for example, a silicon oxide film is next grown using a known CVD (Chemical Vapor Deposition) method, following which the surface of the insulating film is leveled using a known CMP (Chemical Mechanical Polishing) method. The insulating film is next patterned by a known photolithography method and dry etching method to form plug hole 110 for forming a plug electrode as shown in FIG. 2C.

Using an ion implantation method, silicon ions are next implanted into the silicon substrate at an implantation dosage of $1\times10^{14}$ atoms/cm2 and with an acceleration voltage of approximately 40 KeV, following which the photoresist is removed.

The silicon substrate is next cleaned using any one of: a solution of dilute hydrofluoric acid, a mixed aqueous solution of dilute hydrofluoric acid and hydrogen peroxide, a mixed aqueous solution of dilute sulfuric acid and hydrogen peroxide, and a mixed aqueous solution of dilute ammonia water and hydrogen peroxide.

Figure 2D:
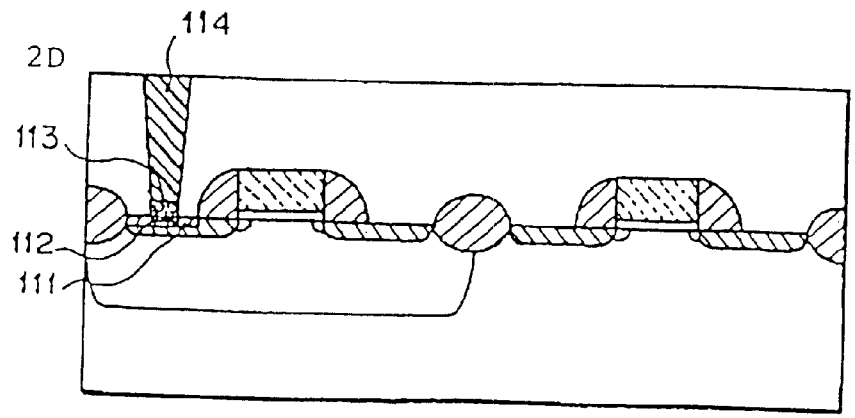
Figure 3C:
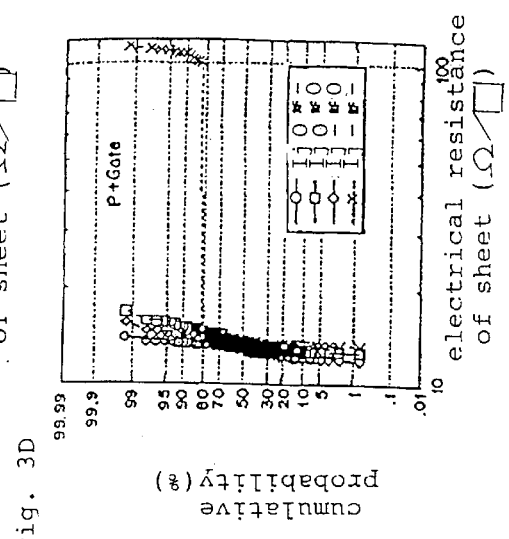
FIGS. 3A to 3D show a comparison between plug resistance for a case in which a titanium film and titanium nitride film are formed as a metal diffusion barrier layer after implanting silicon ions following formation of a plug hole in the fabrication method of the present invention and plug resistance for a case in which a titanium film and a titanium nitride film are formed as a metal diffusion barrier layer using a method of the prior art.
Figure 3D:
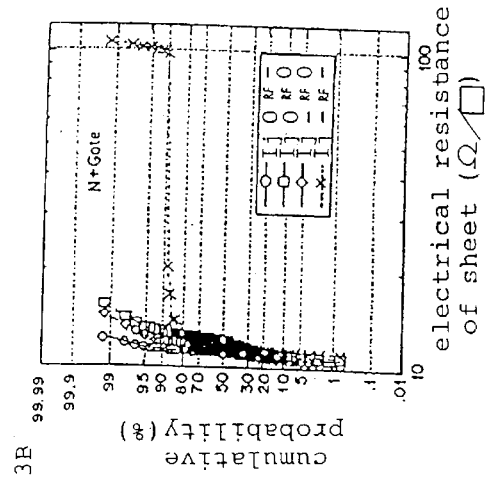
Figure 3A:
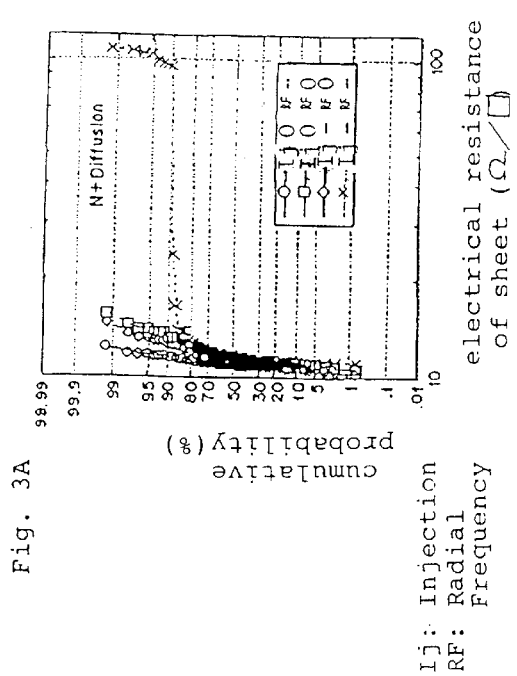
Figure 3B:
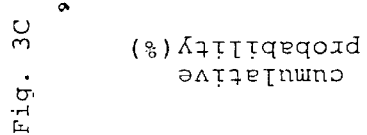
Figure 4C:
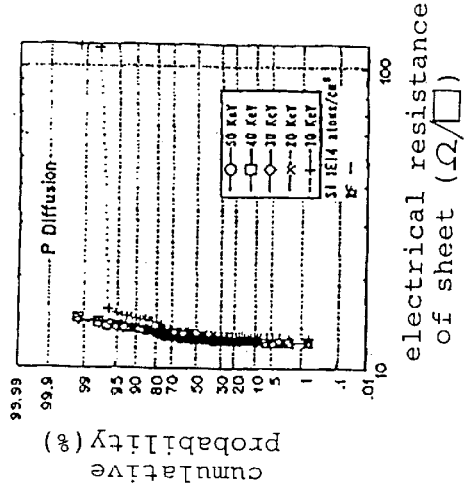
FIGS. 4A to 4D show the relation between plug resistance and the acceleration voltage of ion implantation in a case, in which a titanium film and a titanium nitride film are formed as a metal diffusion barrier layer after implanting silicon ions following formation of a plug hole, in the fabrication method of the present invention.
Figure 4D:
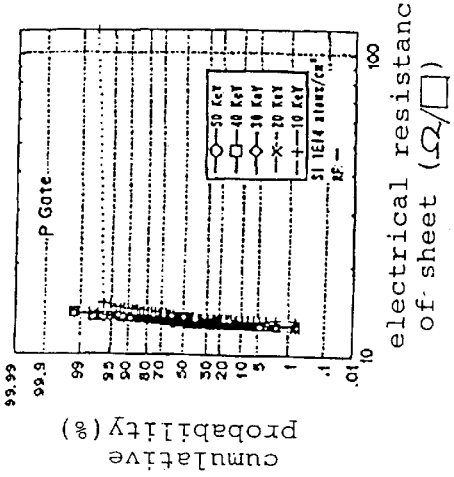
Figure 4A:
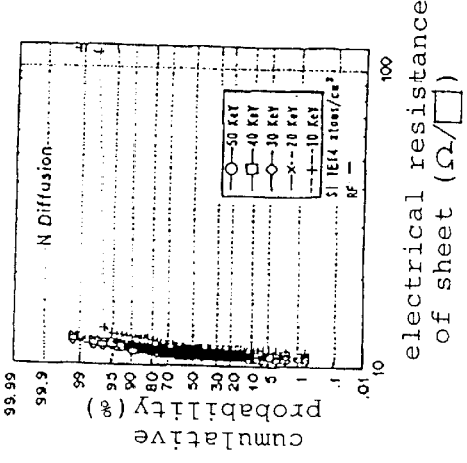
Figure 4B:
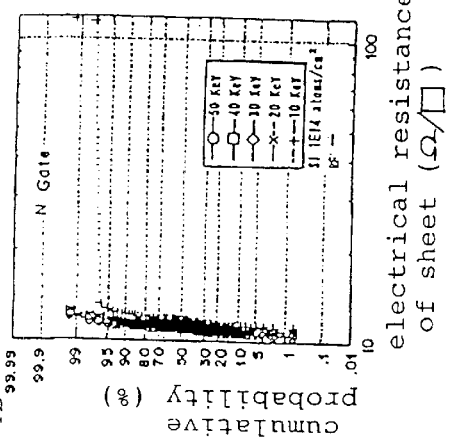

Next, as shown in FIG. 2D, a titanium film is grown using a magnetron sputtering method at a temperature of, for example, approximately 300° C. and in an argon atmosphere. Immediately after this step, a titanium nitride film is grown by a sputtering method in a nitrogen atmosphere, following which RTA (Rapid Thermal Annealing) is carried out. Titanium silicide film 111, titanium film 112, and titanium nitride film 113 are thus formed as metal diffusion barrier layers in the plug hole. In this method, increase in the resistance of the cobalt silicide film at the bottom of the plug hole can be markedly suppressed.

A tungsten film is grown by a CVD method, which is a known method, following which first layer wiring plug 114 is formed using a dry etching method or a CMP method, which are also known methods.

Although a case was described in the above-described embodiment in which cobalt disilicide was formed on the gate electrode as well as on the diffusion layer, it goes without saying that the present invention may also be applied in cases in which a silicide is formed by sputtering metals such as nickel, iron, and titanium in place of cobalt.

Furthermore, although a case was described in the above-described embodiment in which a metal silicide film was formed with self-alignment as the gate electrode, it is obvious that a similar effect is obtained in cases in which the gate electrode is formed by a metal silicide of tungsten or titanium.

(The First Working Example)

A MOS transistor is fabricated having p-type and n-type gate electrodes and a diffusion layer electrode on a silicon substrate. Next, the surfaces of the gate electrodes and the surface of the diffusion layer electrode are converted to cobalt silicide self-alignmently, an insulating film is grown by a CVD method, and the surfaces are polished, following which a plug hole is formed. After performing ion implantation under the following conditions and carrying out a sputtering experiment, a tungsten film is grown by a CVD method. The surfaces are then polished, and plug electrodes are formed.

Silicon ion implantation conditions after formation of plug holes:

Acceleration voltage: 10, 20, 30, 40, and 50 KeV

Dosage: $1\times10^{12}$, $1\times10^{13}$, $1\times10^{14}$, and $1\times10^{15}$ atoms/cm2

For purposes of comparison with another method, a sample was prepared in which silicon ion implantation was not carried out.

RF sputtering conditions:

Amount of gas flow: Ar 20 sccm+O2 4 sccm

Processing time: 90 seconds

Holder temperature: 150° C.

For purposes of comparison with another method, a sample was prepared in which RF sputtering was not performed. The conditions for growing the titanium film and titanium nitride films by sputtering were as follows:

Holder temperature: 200° C.–350° C.

Chamber pressure: 3–8 mTorr (nitrogen/argon)

Heating time: 1–5 minutes

Amount of film growth: 500 Å (titanium nitride film)/300 Å (titanium film)

Wafer dimension: 200 mm in diameter

Next, the resistance of the plug electrode portion was investigated for a test sample in which a titanium film and titanium nitride film were grown by a sputtering method but in which RF etching was not performed; only silicon ion implantation and cleaning being performed immediately after formation of the plug hole.

FIGS. 3A to 3D show the results of measurement of the distribution of sheet resistance within the wafer surface for cases in which the structure of the bottom of the plug hole was: an n-type diffusion layer electrode, an n-type gate electrode; a p-type diffusion layer electrode; and a p-type gate electrode. As reference data, results are shown together for: a case similar to the above-described method in which, immediately after formation of the plug hole, silicon ions were implanted, cleaning and RF etching carried out, and then the titanium and titanium nitride films were grown by sputtering; a prior-art case in which, immediately after formation of the plug hole, cleaning and RF etching were carried out without performing ion implantation, following which the titanium film and titanium nitride film were grown by sputtering; and yet another case in which, as in the prior art, the titanium film and titanium nitride film were grown by sputtering without performing RF etching. In addition, the plug holes that were rated measured 0.5 µm in diameter, and in all cases, silicon ion implantation was carried out with an acceleration voltage of 40 KeV and to a dosage of 1×1014 atoms/cm2.

As can be understood from FIGS. 3A to 3D, in all the cases in which the structure of the bottom of the plug hole was an n-type diffusion layer electrode, an n-type gate electrode, a p-type diffusion layer electrode, and a p-type gate electrode, the lowest resistance and the least variation within the wafer surface was obtained for a case in which, immediately after formation of the plug hole, silicon ions were implanted, cleaning was carried out without performing RF etching, and the titanium film and titanium nitride film were then grown by sputtering.

In contrast, variation within the wafer surface is largest for a case in which RF etching alone is not performed in a method similar to the prior art. Regardless of whether or not ion implantation is performed immediately after formation of the plug hole, overall resistance is high and variation is rather high for cases in which a titanium film and titanium nitride film are grown by sputtering after cleaning and RF etching have been carried out.

Plug resistance was further investigated for cases in which, in a method similar to the method described above, the acceleration voltage for implantation of silicon ions immediately after formation of the plug hole was 10 KeV, 20 KeV, 30 KeV, 40 KeV, and 50 KeV. In this experiment, RF etching was not performed immediately before sputtering. FIGS. 4A to 4D show the results of measurement of the distribution of sheet resistance within the wafer surface for each of the cases in which the structure of the plug hole bottom was an n-type diffusion layer electrode, an n-type gate electrode, a p-type diffusion layer electrode, and a p-type gate electrode.

As can be understood from FIGS. 4A to 4D, variation in plug resistance within the wafer surface was lowest with sheet resistance being substantially equal in cases in which the acceleration voltage was at least 20 KeV regardless of whether the structure of the plug bottom was an n-type diffusion layer electrode, an n-type gate electrode, a p-type diffusion layer electrode, or a p-type gate electrode. When the acceleration. voltage was 10 KeV, in contrast, resistance became high in portions of the wafer.

Plug resistance was further investigated for cases in which, in a method similar to the method described above, the dosage of silicon ion implantation immediately following formation of the plug hole was 1×1012 atoms/cm2, 1×1013 atoms/cm2, 1×1014 atoms/cm2, and 1×1015 atoms/cm2. In this experiment, RF etching was not performed immediately before sputtering.

FIGS. 5A to 5D show the results of measurement of the distribution of sheet resistance within the wafer surface for cases in which the structure of the plug hole bottom was an n-type diffusion layer electrode, an n-type gate electrode, a p-type diffusion layer electrode, and a p-type gate electrode.

As can be understood from FIGS. 5A to 5D, variation in plug resistance was smallest and the sheet resistance was substantially equal for cases in which the dosage was equal to or larger than 1×1013 atoms/cm2 regardless of whether the structure of the plug bottom was an n-type diffusion layer electrode, an n-type gate electrode, a p-type diffusion layer electrode, or a p-type gate electrode. In contrast, the resistance was high in a portion of the wafer when the dosage was 1×1012 atoms/cm2.

According to the present invention, in a method of fabricating a semiconductor device in which a metal film, which is to become a diffusion barrier layer of an inter-element plug electrode of a semiconductor element, is formed over the entire surface of a silicon substrate using a sputtering deposition method, the amount of etching of the surfaces of the gate electrodes and diffusion layer electrodes in the bottom portion of the plug hole is suppressed and the adhesion between the diffusion barrier layer and the surfaces of the gate electrode and the diffusion layer electrode is improved, thereby decreasing the resistance of the inter-element wiring portion of an MOS field effect transistor (MOSFET) that is designed for lower resistance.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A method of fabricating a semiconductor device in which a metal film that is to serve as a diffusion barrier layer of inter-element plug electrodes of semiconductor elements is formed over entire surface of a silicon substrate using a sputter deposition method; wherein:

before said sputter deposition of said metal film, all portions of said substrate are covered by a photoresist excepting portions of plug formation, following which silicon ions are implanted into said substrate, said photoresist is removed, and finally, said substrate is cleaned with a chemical fluid.

2. A method of fabricating a semiconductor device according to claim 1, wherein the acceleration voltage when implanting said silicon ions is at least 20 KeV.

3. A method of fabricating a semiconductor device according to claim 1, wherein the ionic valence when implanting said silicon ions is 1.

4. A method of fabricating a semiconductor device according to claim 1, wherein the dosage when implanting said silicon ions is at least $1\times10^{13}$ atoms/cm$^2$.

5. A method of fabricating a semiconductor device according to claim 1, wherein said chemical fluid for cleaning the substrate is one of: a dilute hydrofluoric acid solution, a mixed aqueous solution of dilute hydrofluoric acid and hydrogen peroxide, a mixed aqueous solution of dilute sulfuric acid and hydrogen peroxide, and a mixed aqueous solution of dilute ammonia water and hydrogen peroxide.

6. A method of fabricating a semiconductor device according to claim 1, wherein a chemical compound containing silicon is present at the bottom of said plug formation portion.

7. A method of fabricating a semiconductor device according to claim 6, wherein said chemical compound is the element silicon or a metal silicide.

8. A method of fabricating a semiconductor device according to claim 7, wherein the metal that forms said metal silicide is one of titanium, iron, cobalt, nickel, tantalum, tungsten, and platinum.

9. A method of fabricating a semiconductor device according to claim 1, wherein said metal film is a combination of a titanium film and a titanium nitride film.

10. A method of fabricating a semiconductor device according to claim 1, wherein the metal that forms said plug electrode is one of aluminum, copper, tungsten, and platinum.

* * * * *